United States Patent
Furuhata et al.

(10) Patent No.: US 7,126,178 B2
(45) Date of Patent: Oct. 24, 2006

(54) SEMICONDUCTOR DEVICE AND ITS MANUFACTURING METHOD

(75) Inventors: Takeo Furuhata, Mie (JP); Ichiro Mizushima, Kanagawa (JP); Akiko Sekihara, Kanagawa (JP); Motoya Kishida, Kanagawa (JP); Tsubasa Harada, Kanagawa (JP); Takashi Nakao, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/068,848

(22) Filed: Mar. 2, 2005

(65) Prior Publication Data

US 2005/0170582 A1 Aug. 4, 2005

Related U.S. Application Data

(63) Continuation of application No. 10/410,442, filed on Apr. 10, 2003, now Pat. No. 6,946,699.

(30) Foreign Application Priority Data

Nov. 28, 2002 (JP) ............................. 2002-344959

(51) Int. Cl.
*H01L 27/108* (2006.01)
*H01L 21/8242* (2006.01)
(52) U.S. Cl. ...................... 257/301; 257/304
(58) Field of Classification Search ........ 257/296–302, 257/301–305
See application file for complete search history.

(56) References Cited

U.S. PATENT DOCUMENTS

| | | | |
|---|---|---|---|
| 6,359,300 B1 | 3/2002 | Economikos et al. | |
| 6,436,760 B1 | 8/2002 | Wong et al. | |
| 6,552,380 B1 | 4/2003 | Sato et al. | |
| 2001/0042880 A1* | 11/2001 | Divakaruni et al. | 257/301 |
| 2002/0142571 A1 | 10/2002 | Noguchi | |
| 2002/0171099 A1 | 11/2002 | Sato et al. | |
| 2003/0013259 A1* | 1/2003 | Chidambarrao et al. | 438/301 |
| 2004/0082137 A1 | 4/2004 | Huang et al. | |

FOREIGN PATENT DOCUMENTS

JP 2000-269462 9/2000

* cited by examiner

*Primary Examiner*—H. Jey Tsai
(74) *Attorney, Agent, or Firm*—Finnegan, Henderson, Farabow, Garrett & Dunner, L.L.P.

(57) ABSTRACT

A semiconductor device comprises a semiconductor substrate; a trench formed in the semiconductor substrate or in a layer deposited on the semiconductor substrate; a first conductive layer deposited in the trench and having a recess in the top surface thereof; a buried layer which buries the recess of the first conductive layer and which is made of a material having a melting point lower than that of the first conductive layer; and a second conductive layer formed on the buried layer inside the trench and electrically connected to the first conductive layer.

14 Claims, 7 Drawing Sheets

PRIOR ART

FIG. 6

SEMICONDUCTOR DEVICE AND ITS MANUFACTURING METHOD

CROSS-REFERENCE TO RELATED APPLICATIONS

This is a continuation of application Ser. No. 10/410,442, filed Apr. 10, 2003, now U.S. Pat. No. 6,946,699, which is incorporated herein by reference.

This application is based upon and claims the benefit of priority from the prior Japanese Patent Application No. 2002-344959, filed on Nov. 28, 2002, the entire contents of which are incorporated herein by reference.

BACKGROUND OF THE INVENTION

1. Field of the Invention

This invention relates to a semiconductor device and its manufacturing method.

2. Related Background Art

Along with progressive integration density and microminiaturization of semiconductor devices, including DRAM and other memory devices, the area occupied by each element has been reduced from one generation to another. For such enhancement of the integration density and microminiaturization, trench capacitors have often been used in memory cells. For further microminiaturization of semiconductor devices using trench capacitors, the diameter of the trench of each trench capacitor must be reduced.

Figure 6:
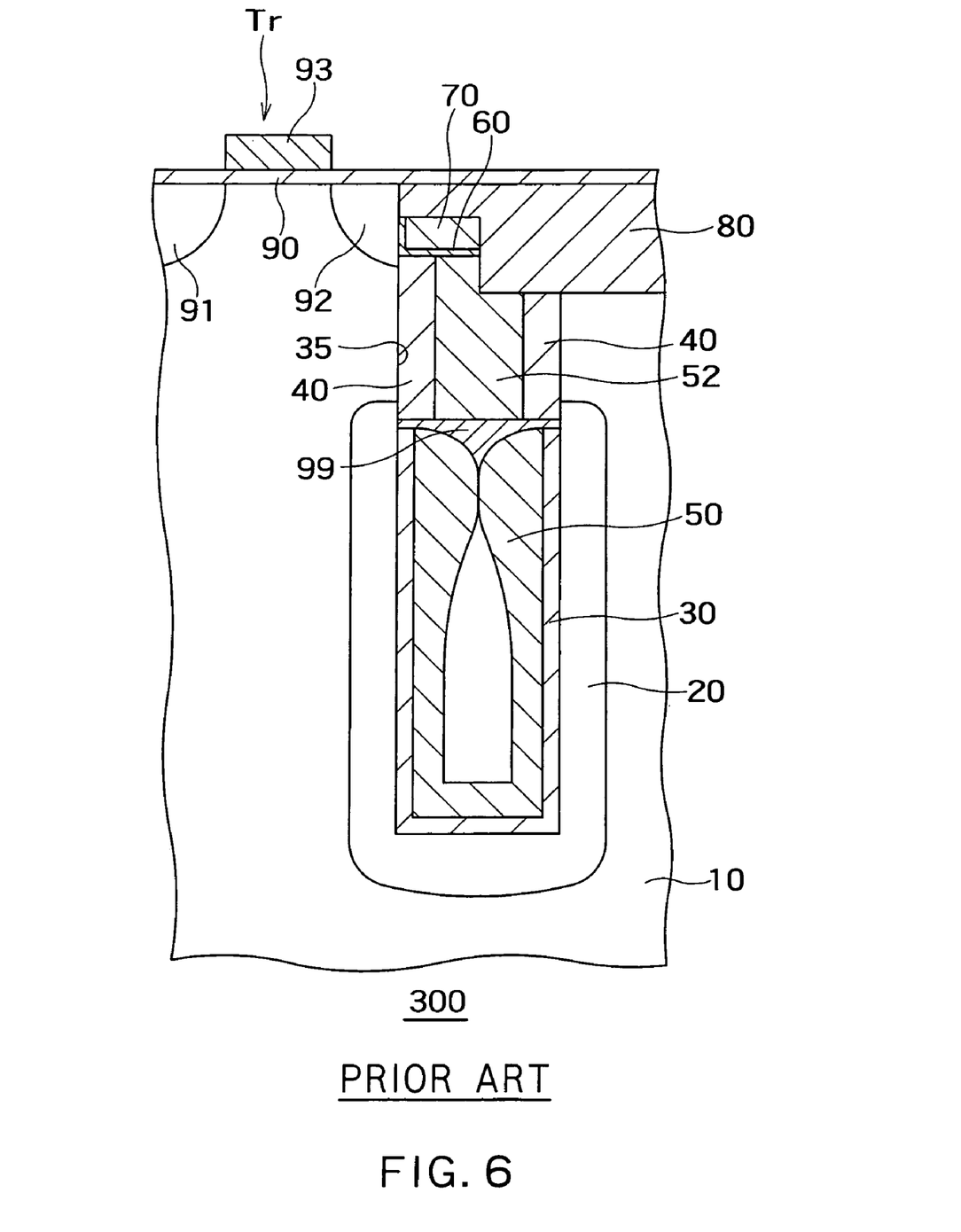
FIG. 6 is a cross-sectional view of a memory cell region of an existing semiconductor device 300.

FIG. 6 is a cross-sectional view of a memory cell region of an existing semiconductor device 300. The semiconductor device 300 includes a monocrystal silicon substrate 10, plate electrode 20, capacitor insulating film 30, collar insulating film 40, first storage node electrode 50, second storage node electrode 52, SiN layer or SiO$_2$ layer 60, buried strap 70, element-isolating/insulating film 80, gate insulating film 90, source/drain diffusion layers 91, 92, gate electrode 93 and insulating residue 99. The storage node electrodes 50, 52 and buried strap 70 are made of doped polysilicon.

The gate insulating film 90, source/drain diffusion layers 91, 92 and gate electrode 93 makeup a MOS transistor Tr. The plate electrode 20, capacitor insulating film 30 and first storage node electrode 50 are formed inside a trench 35 to function as a trench capacitor. Therefore, an electric charge coming through the transistor Tr, SiN or SiO$_2$ layer 60 and the buried strap 70 is stored in the storage node electrode 50. Thus the corresponding data is written. On the other hand, the electric charge is released from the storage node electrode 50 via the SiN or SiO$_2$ layer 60 to the transistor Tr. Thus the data is erased. Writing and erasure of data can be executed in this manner.

However, in case the diameter of the trench 35 e is reduced to enhance the integration density of the semiconductor device 300, an insulating residue 99 is produced. The insulating residue 99 may insulate the first and second storage node electrodes 50, 52 from each other, and may make it impossible to store the charge in the first storage node electrode 50 or release the charge from the first storage node electrode 50. This means that the device fails to write or erase data.

With reference to FIGS. 7A through 7D, the cause of the production of the insulating residue 99 is explained below. FIGS. 7A through 7D are cross-sectional views of the semiconductor device 300 in the order of its manufacturing steps to show the cause of the production of the insulating residue 99. FIGS. 7A through 7D show only the trench capacitor region, omitting the transistor region.

Figure 7A:
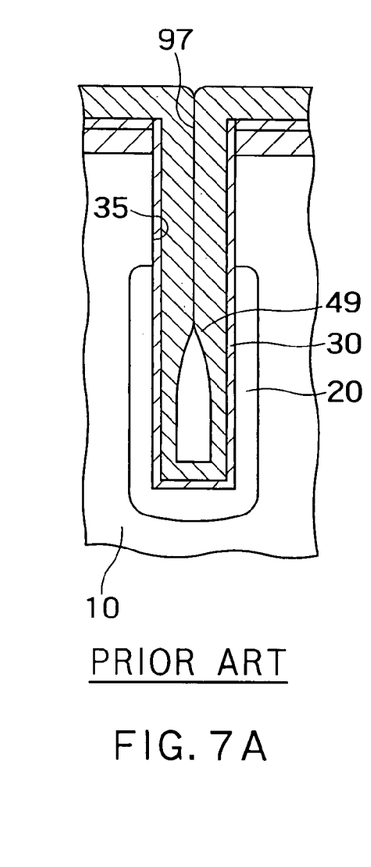
FIG. 7A is a cross-sectional view of a trench capacitor region under a manufacturing process of the semiconductor device 300.

A silicon substrate 10 is processed by a known method to form the trench 35 and the plate electrode 20. The capacitor insulating film 30 is formed by oxidizing the inner wall of the trench 35. Next as shown in FIG. 7A, polysilicon 49 is deposited inside the trench 35. In case the trench 35 has a small diameter, a seam 97 remains in the polysilicon 49 when the polysilicon 49 is deposited.

Figure 7B:
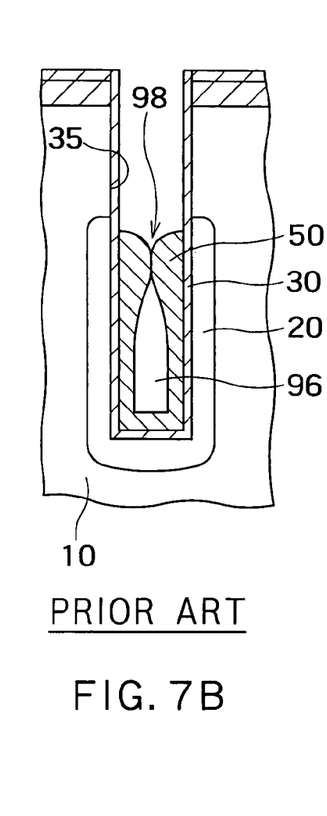
FIG. 7B is a cross-sectional view of the trench capacitor region under a manufacturing process following to FIG. 7A.

As shown in FIG. 7B, the polysilicon 49 is next etched back by RIE (reactive ion etching). As a result, the first storage node electrode 50 is formed. During this etching, the etching gas not only licks the top surface of the polysilicon 49 but also intrudes into the seam 97. As a result, a V-shaped recess 98 as shown in FIG. 7B appears on the top surface of the first storage node electrode 50.

Figure 7C:
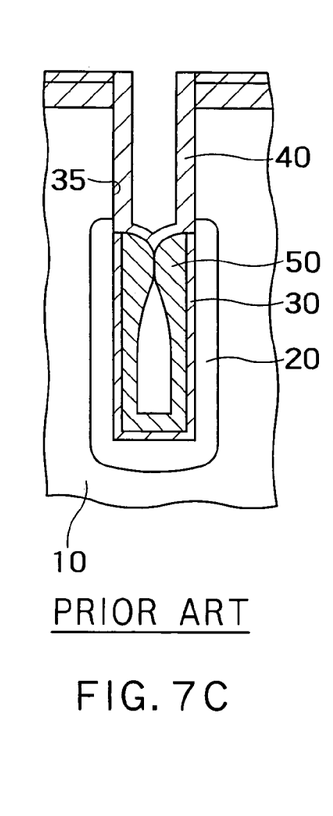
FIG. 7C is a cross-sectional view of the trench capacitor region under a manufacturing process following to FIG. 7B.

As shown in FIG. 7C, the capacitor insulating film 30 is next partly removed by etching using the first storage node electrode 50 as a mask to expose the upper part of the trench 35. Thereafter, a silicon oxide film is deposited on the inner wall of the trench 35.

Figure 7D:
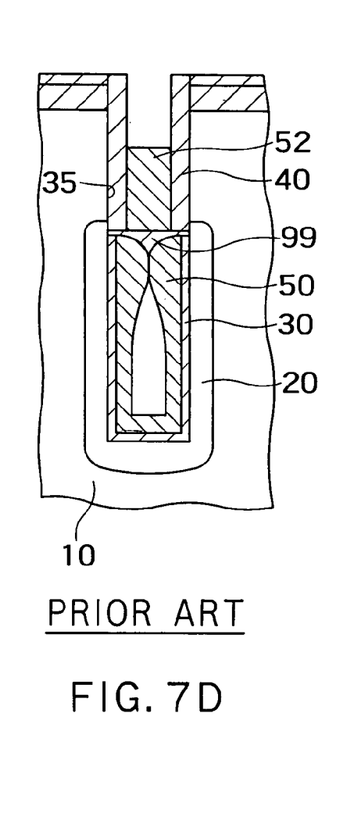
FIG. 7D is a cross-sectional view of the trench capacitor region under a manufacturing process following to FIG. 7C.

As shown in FIG. 7D, the silicon oxide film is next partly removed by RIE to obtain a collar oxide film 40 of a desired thickness. Thereafter, polysilicon is once deposited and thereafter etched back by RIE to form the second storage node electrode 52.

However, in the process of forming the collar oxide film 40, the silicon oxide film is not removed from inside the V-shaped recess and remains therein as an oxide residue 99. As explained above, the oxide residue prevents electrical connection between the first and second storage node electrodes 50, 52.

If the etching is carried out more heavily to completely remove the oxide residue 99 in the process of forming the collar oxide film 40, then the collar oxide film 40 will become tooth in. That is, the heavier etching results in making a sacrifice of appropriate adjustment of the collar oxide film 40 in thickness.

The recess 98 appears when the trench 35 is reduced in diameter and results in having a large aspect ratio. Therefore, reducing the aspect ratio could be a way of removing the recess 98. However, the increase of the diameter of the trench 35 for reducing the aspect ratio goes against the requirements of higher integration and microminiaturization.

Another countermeasure may be to use a semiconductor material having a lower melting point than silicon, such as germanium or silicon germanium, as the material of the storage node electrode 50 and level the recess 98 by annealing the storage node electrode 50.

However, in case a void 96 exists inside the first storage node electrode 50 (see FIG. 7B), the first storage node electrode 50, which is molten by annealing, may tumble into the void 96 and may peel off from the capacitor insulating film 30. Then the capacitance of the trench capacitor will decrease, or part of the first storage node electrode 50 will separate. As a result, the first storage node electrode 50 will fail to function as the electrode.

It is, therefore, desirable to provide a semiconductor device and its manufacturing method that ensure reliable connection between the first and second conductors in the trench and meet the requirements of higher integration and microminiaturization.

SUMMARY OF THE INVENTION

A semiconductor device comprises a semiconductor substrate; a trench formed in the semiconductor substrate or in a layer deposited on the semiconductor substrate; a first conductive layer deposited in the trench and having a recess in the top surface thereof; a buried layer which buries the recess of the first conductive layer and which is made of a material having a melting point lower than that of the first conductive layer; and a second conductive layer formed on the buried layer inside the trench and electrically connected to the first conductive layer.

A method of manufacturing a semiconductor device, comprising forming a trench in a semiconductor substrate or in a layer deposited on the semiconductor substrate; depositing a first conductive layer in the trench; etching a part of the first conductive layer in a relatively upper location in the trench; depositing an electrically conductive and burying-use material having a melting point lower than that of the first conductive layer on a recess that is produced in the top surface of the first conductive layer in the step of etching the first conductive layer; heating the burying-use material to a temperature higher than the melting point thereof and lower than the melting point of the first conductive layer; etching the burying-use material to remove the part thereof from the sidewall of the trench and maintain the part thereof near the recess, and depositing a second conductive layer on the burying-use material in the recess.

DETAILED DESCRIPTION OF THE INVENTION

Some embodiments of the invention will now be explained below with reference to the drawings. However, these embodiments should not be construed to limit the invention. The effects of the embodiments will still be maintained even when the embodiments are changed in conduction types of respective components.

First Embodiment

Figure 1:
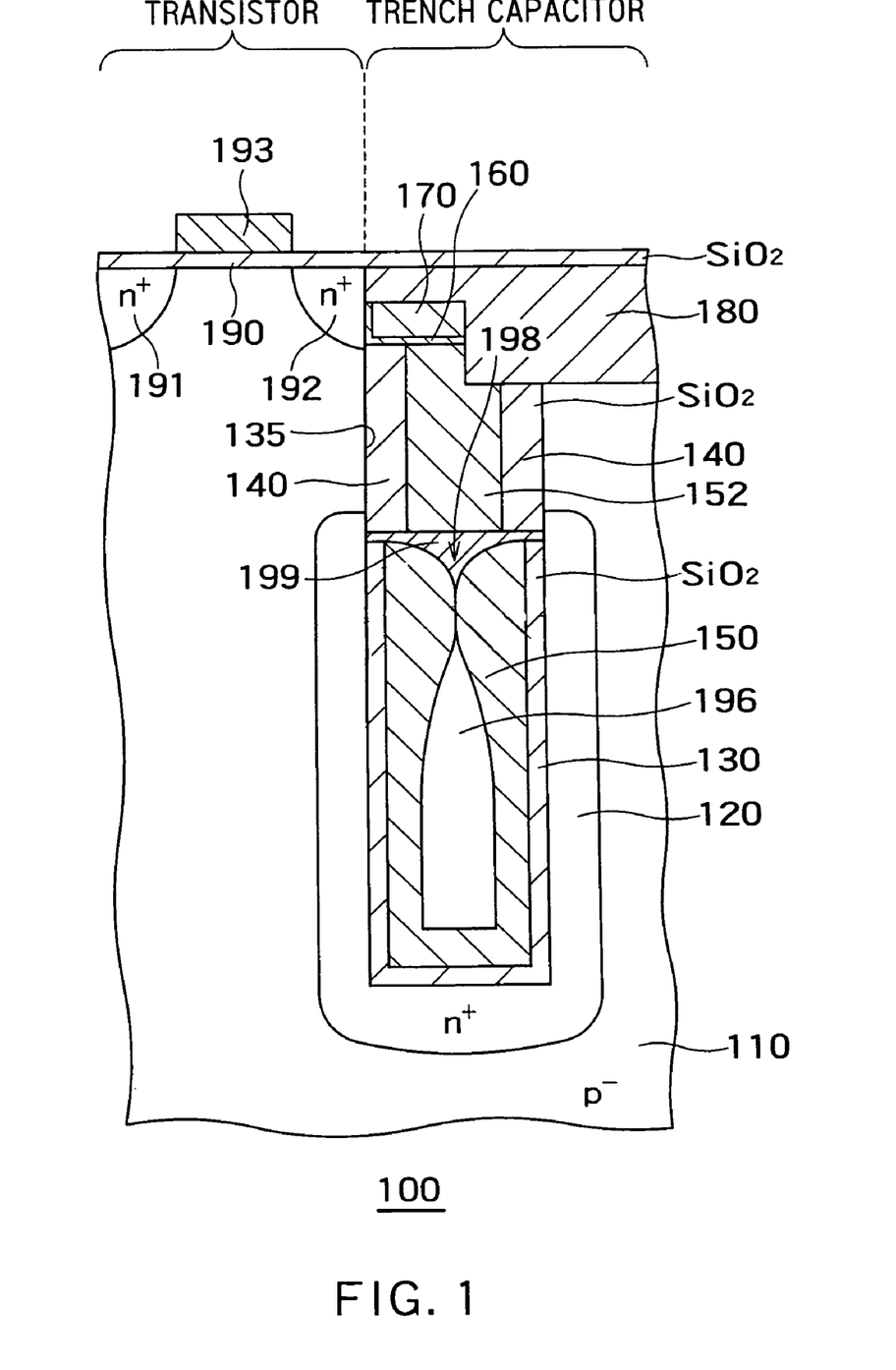
FIG. 1 is a cross-sectional view of a memory cell of a semiconductor device 100 according to an embodiment of the invention.

FIG. 1 is a cross-sectional view of a memory cell of a semiconductor device 100 according to an embodiment of the invention. FIG. 1 shows a DRAM-type memory cell composed of a pair of a transistor and a capacitor. The trench capacitor region of the memory cell includes a trench 135 formed in a p$^-$-type monocrystal silicon substrate 110. Inside the trench 135, there are provided a capacitor insulating film 130, a collar insulating film 140, a first storage node electrode 150, a second storage node electrode 152, an insulating thin-film portion 160, a buried strap 170 and a buried layer 199. In a part of the silicon substrate 110 around the trench 135, a plate electrode 120 is provided. The trench capacitor region also includes an element-isolating layer 180.

The transistor region of the memory cell includes a gate insulating film 190, source/drain diffusion layers 191, 192, and gate electrode 193 that make up a MOS transistor. The plate electrode 120, capacitor insulating film 130 and first storage node electrode 150 function as a trench capacitor.

Upon data writing, an electric charge coming through the transistor, insulating thin-film portion 160 and buried strap 170 is stored in the storage node electrode 150. Thus the corresponding data is written.

Upon data erasure, the electric charge is released from the first storage node electrode 150 to the transistor through the insulating thin-film portion 160 and the buried strap 170. Thus the data is erased. Writing and erasure of data can be executed in this manner.

The collar insulating film 140 is thicker than the capacitor insulating film 130 so that a channel is not formed between the diffusion layer 192 and the plate electrode 120 when the potential of the second storage node electrode 152 is high.

The insulating thin-film portion 160 isolates the buried strap 170 from the monocrystal silicon substrate 110 and thereby prevents the buried strap 170 from changing to a monocrystal from its portion in contact with the monocrystal silicon substrate 110. The insulating thin-film portion 160 is thin enough to permit the electric charge to pass through it easily, and it does not adversely affect the data writing and erasure.

The plate electrode 120 and the source/drain diffusion layers 191, 192 are n$^+$-type impurity diffusion layers, for example. The first and second storage node electrodes 150, 152 and the buried strap 170 are made of n-doped polysilicon, for example. The capacitor insulating film 130, collar-insulating film 140, insulating thin-film portion 160 and gate insulating film 190 are made of insulating materials such as silicon oxide films or silicon nitride films, for example.

The buried layer 199 is made of an electrically conductive material having a melting point lower than that of the first storage node electrode 150. It may be germanium containing an n-type impurity or silicon germanium ($Si_XGe_{(1-X)}$ (0<X<1)) containing an n-type impurity. The melting point of the polysilicon is approximately 1412 degrees. The melting point of germanium is approximately 940 degrees. Thus the melting point of silicon germanium ($Si_XGe_{(1-X)}$) is determined by the value of X in the range from 940 to 1412 degrees.

The buried layer 199 is embedded inside a V-shaped recess 198 sunken from the top surface of the first storage node electrode 150. Since the buried layer 199 is electrically conductive, the first storage node electrode 150 is electrically connected to the second storage node electrode 152. Therefore, the first and second storage node electrodes 150, 152 can reliably store charges from the transistors, respectively.

Next explained is a manufacturing method of the semiconductor device 100.

FIGS. 2A through 4C are cross-sectional views that successively show the trench capacitor region of the semiconductor device 100 under sequential processes of the manufacturing. FIGS. 2A through 3C only show the trench capacitor region and omit illustration of the transistor region.

Figure 2A:
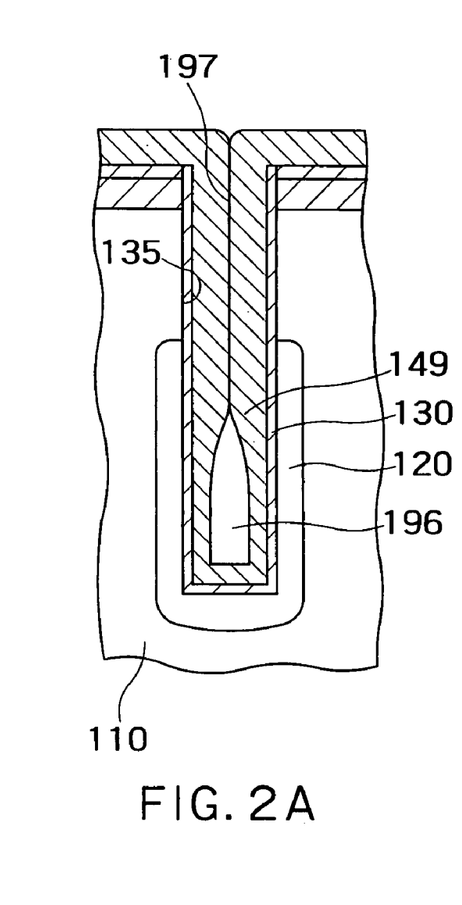
FIG. 2A is a cross-sectional view of a trench capacitor region under a manufacturing process of the semiconductor device 100.

By known methods, the trench 135 and the plate electrode 120 are formed in the semiconductor substrate 110. Thereafter, through oxidation of the inner wall of the trench 135 and deposition of an insulating material, the capacitor insulating film 130 is formed. After that, as shown in FIG. 2A, polysilicon 149 is deposited inside the trench 135. Since the trench 135 has a small diameter, a seam 197 and a void 196 are produced in the polysilicon 149 in the deposition process of the polysilicon 149 and remain there.

Figure 2B:
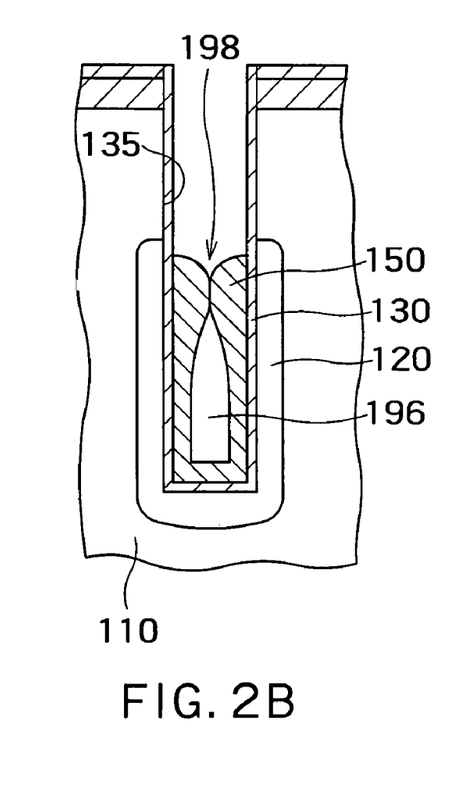
FIG. 2B is a cross-sectional view of the trench capacitor region under a manufacturing process following to FIG. 2A.

As shown in FIG. 2B, the polysilicon 149 is next etched back by RIE. As a result, the first storage node electrode 150 is formed to sit at a relatively low level in the trench 135. In this etching process, the etching gas not only licks the top surface of the polysilicon 149 but also intrudes into the seam 197. Therefore, the approximately V-shaped recess 198 as shown in FIG. 2B is formed to sink from the top surface of the first storage node electrode 150.

After that, the capacitor insulating film 130 is selectively etched via the first storage node electrode 150 used as the mask, thereby to expose the top portion of the trench 135.

Figure 2C:
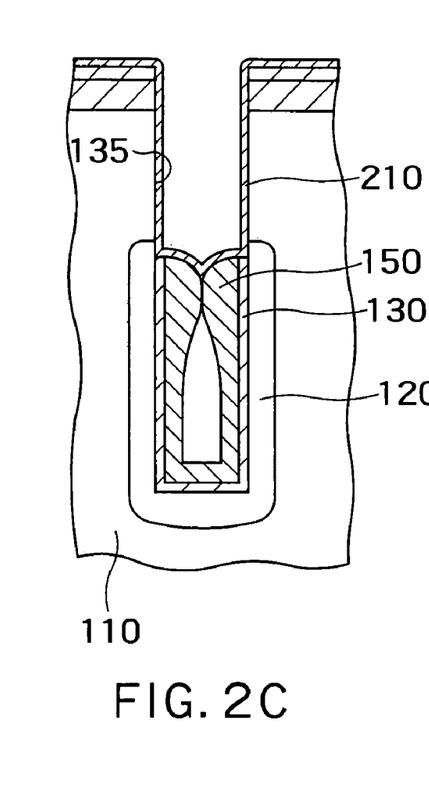
FIG. 2C a cross-sectional view of the trench capacitor region under a manufacturing process following to FIG. 2B.

As shown in FIG. 2C, germanium (Ge) or silicon germanium ($Si_XGe_{(1-X)}$) is deposited as the burying-use material 210 to be used as the buried layer 199. If silicon germanium is used here, then the deposition is carried out under the conditions of: air pressure in the range from 1 to 5 torr; temperature in the range from 400 to 600° C.; and flow rate of the gas containing $SiH_4$ and $GeH_4$ in the range 50 to 3000 sccm approximately. If germanium is used here, then the deposition may be carried out under the same conditions in terms of air pressure and temperature but using a different gas containing $GeH_4$ and not containing $SiH_4$.

Figure 3A:
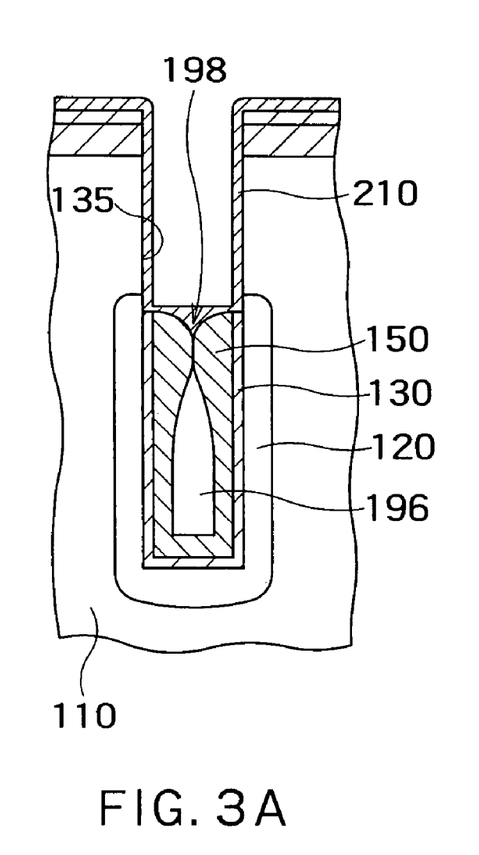
FIG. 3A is a cross-sectional view of the trench capacitor region under a manufacturing process following to FIG. 2C.

Next as shown in FIG. 3A, the substrate is heated to a temperature higher than the melting point of the burying-use material 210 and lower than the melting point of the first storage node electrode 150, for example, such as a temperature higher than the melting point of germanium (Ge) or silicon germanium ($Si_XGe_{(1-X)}$) and lower than the melting point of polysilicon. In greater detail, the substrate is annealed by RTA (rapid thermal annealing) for 15 seconds in a nitrogen atmosphere adjusted to the atmospheric pressure and approximately 1050° C. As a result of the annealing, the burying-use material 210 melts and flows into the recess 198, thereby to level the portion of the recess 198.

The annealing causes the silicon of the first storage node electrode 150 and the germanium component of the burying-use material 210 to interact in the portion of the recess 198. Therefore, the germanium concentration of the burying-use material 210 becomes lower on the sidewall of the trench 135 than near the recess 198. The annealing temperature can be lowered if it is carried out under an air pressure lower than the atmospheric pressure. Although the melting point of germanium is approximately 940 degrees under the atmospheric pressure as mentioned above, the temperature permitting germanium to flow can be lowered to approximately 800 degrees if the annealing is carried out under a low pressure.

Figure 3B:
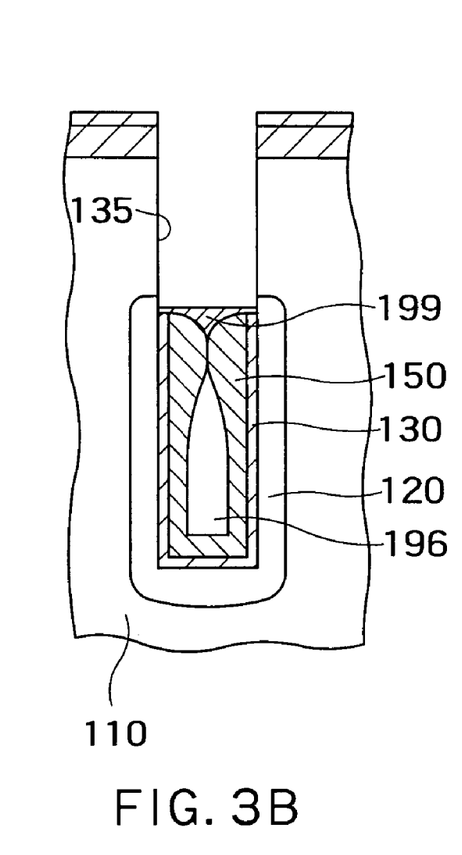
FIG. 3B is a cross-sectional view of the trench capacitor region under a manufacturing process following to FIG. 3A.

Next as shown in FIG. 3B, part of the burying-use material 210 overlying the inner wall of the trench 135 is removed therefrom. If the burying-use material 210 used is germanium or silicon germanium, a solution using hydrogen peroxide ($H_2O_2$) is employed. In greater detail, germanium or silicon germanium can be etched by using a solution containing choline, hydrogen peroxide and water by mixture ratio of 1:1:6 and adjusted to approximately 70° C. To ensure the solution containing hydrogen peroxide to reliably etch silicon germanium ($Si_XGe_{(1-X)}$), (1-X)/X must be approximately 0.3 or more. In other words, the ratio of the germanium concentration relative to the silicon concentration must be approximately 0.3 or more.

As a result of the preceding annealing, the burying-use material 210 has become thicker near the recess 198 than on the sidewall of the trench 135. Therefore, by the etching conducted here, the burying-use material 210 is removed from the sidewall of the trench 135 while it remains near the recess 198.

As already explained, the germanium concentration of the portion on the sidewall of the trench 135 is lower than the germanium concentration of the portion near the recess 198. Therefore, the etching rate of the buried layer 210 is higher on the sidewall of the trench 135 than near the recess 198. As a result, the burying-use material 210 is more likely to be removed from the sidewall of the trench 135 and more likely to remain near the recess 198.

The burying-use material 210 remaining in the recess 198 after the etching by hydrogen peroxide is hereinafter called the buried layer 199.

Figure 3C:
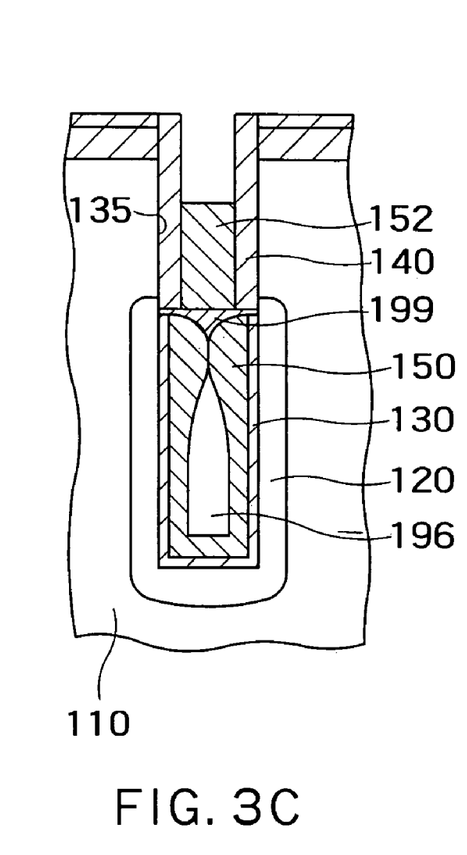
FIG. 3C is a cross-sectional view of the trench capacitor region under a manufacturing process following to FIG. 3B.

As shown in FIG. 3C, the collar insulating film 140 is next deposited in the trench 135. Thereafter, the collar insulating film 140 is partly removed from above the buried layer 199 by RIE and maintained on the relatively upper part of the sidewall of the trench 135. After that, n-type polysilicon is deposited in the trench 135, and partly removed by etchback. As a result, the second storage node electrode 152 is formed on the buried layer 199 inside the trench 135.

Figure 4A:
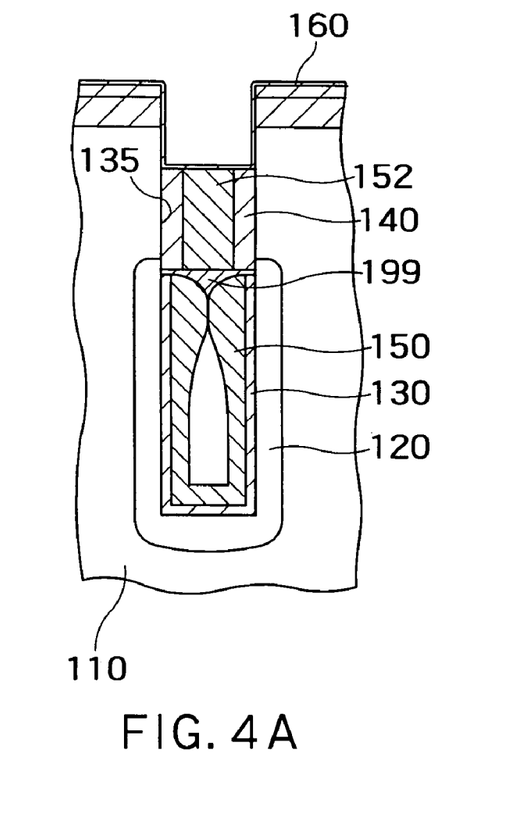
FIG. 4A is a cross-sectional view of the trench capacitor region under a manufacturing process following to FIG. 3C.

As shown in FIG. 4A, the collar insulating film 140 is next etched via the second storage node electrode 152 used as the mask. As a result, the sidewall of the trench 135 above the second storage node electrode 152 is exposed. Additionally, the insulating thin-film layer 160, which is a silicon nitride film or a silicon oxide film, is formed to overlie the sidewall of the trench 135 and the second storage node electrode 152.

Figure 4B:
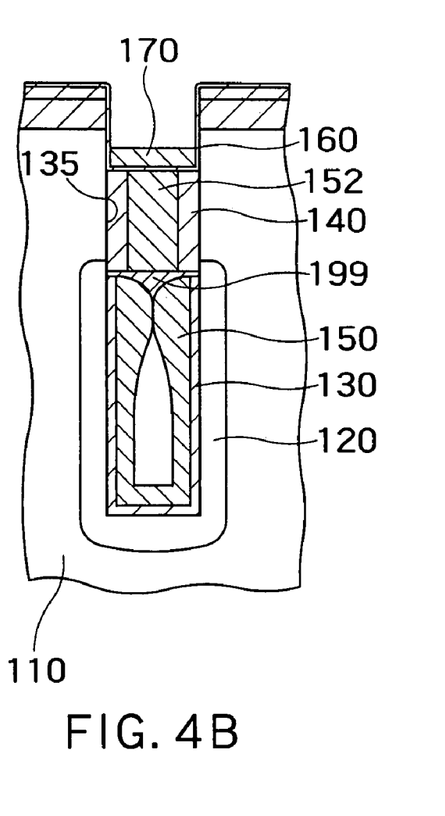
FIG. 4B is a cross-sectional view of the trench capacitor region under a manufacturing process following to FIG. 4A.

As shown in FIG. 4B, polysilicon is next deposited in the trench 135 and subsequently etched back. As a result, the buried strap 170 is formed in the trench 135.

Figure 4C:
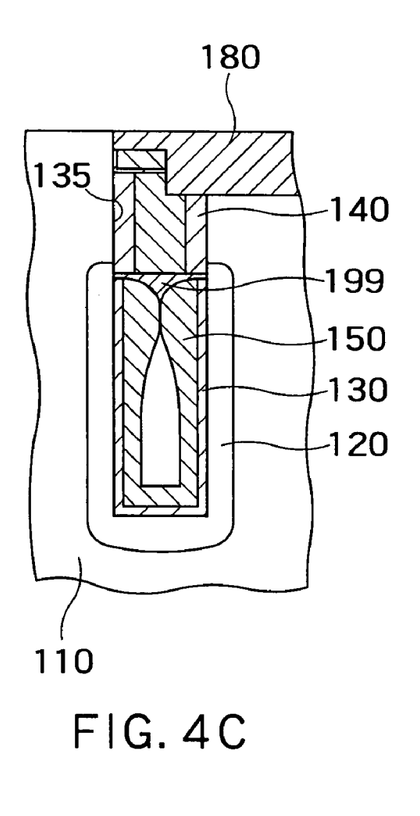
FIG. 4C is a cross-sectional view of the trench capacitor region under a manufacturing process following to FIG. 4B.

As shown in FIG. 4C, a shallow trench for isolation of elements is formed; an insulating film is deposited therein; and CMP is carried out to smooth the insulating film. Thus the element-isolating layer 180 is formed in the shallow trench. The element-isolating layer 180 is formed to overlie the buried strap 170 as well in order to prevent the strap 170 from being short-circuited to the gate interconnection, or the like.

Finally, by known techniques, the gate insulating film 190, gate electrode 193 and source/drain diffusion layers 191, 192 are formed, thereby to complete the semiconductor device 100 having memory cells shown in FIG. 1.

According to the instant embodiment, since the recess 198 is filled with the electrically conductive buried layer 199 prior to deposition of the collar oxide film 140, the collar oxide film 140 never remains in the recess 198. As a result, electrical connection is reliably maintained between the first and second storage node electrodes 151, 152, and the device does not fail to write or erase data.

According to the instant embodiment, the buried layer 199 contains germanium. This enables lowering the resistance of the entirety of the storage node electrodes than a model using only silicon as the buried layer 199. The entirely of the storage node electrodes means the capacitor electrode including the first and second storage node electrodes 151, 152 plus the buried layer 199.

According to the instant embodiment, the burying-use material 210 is silicon germanium, and the underlying first storage node electrode 150 is polysilicon. Therefore, when the burying-use material 210 is annealed (see FIG. 3A), the burying-use material 210 alone flows, and the first storage node electrode 150 does not flow. That is, the part of the first storage node electrode 150 facing the void 196 never exfoliates from the capacitor insulating film 130. Therefore, capacitance of the first storage node electrode 150 does not decrease, and no part of the first storage node electrode 150 separates.

Furthermore, since the instant embodiment is not heated to an excessively high temperature as the melting point of silicon, the leak characteristic of the capacitor insulating film 130 can be improved.

If too much arsenic (As) is doped in the first storage node electrode 150, it makes it difficult to deposit the first storage node electrode 150 in the small-diameter trench 135 (this is hereinafter referred to as "the coverage issue"). To avoid the coverage issue, the doped quantity of arsenic in the first storage node electrode 150 may be limited. In this case, the resistance value of the first storage node electrode 150 will undesirably increase. In general, arsenic is more likely to diffuse in germanium or silicon germanium than in silicon. To cope with this problem, as the instant embodiment proposes, it is possible to use germanium or silicon germanium as the burying-use material 210 and thereby facilitate diffusion of the doped arsenic to the first storage node electrode 150. Thus the resistance of the first storage node electrode 150 can be reduced.

In case the arsenic concentration of the second storage node electrode 152 is low, arsenic may be diffused from the first storage node electrode 150 to the second storage node electrode 152.

Although the instant embodiment provides two storage node electrodes in the single trench 135, three or more storage node electrodes may be provided in the trench 135, depending upon its aspect ratio. Among these three or more electrodes, any two electrodes that are adjacent in the upper and lower directions can be used as the first and second storage node electrodes 150, 152.

Second Embodiment

The first embodiment has been explained as using the buried layer in the trench capacitor of the DRAM memory cell The buried layer, however, is applicable to other types of memory including trench capacitors, contact portions or interconnections.

Figure 5:
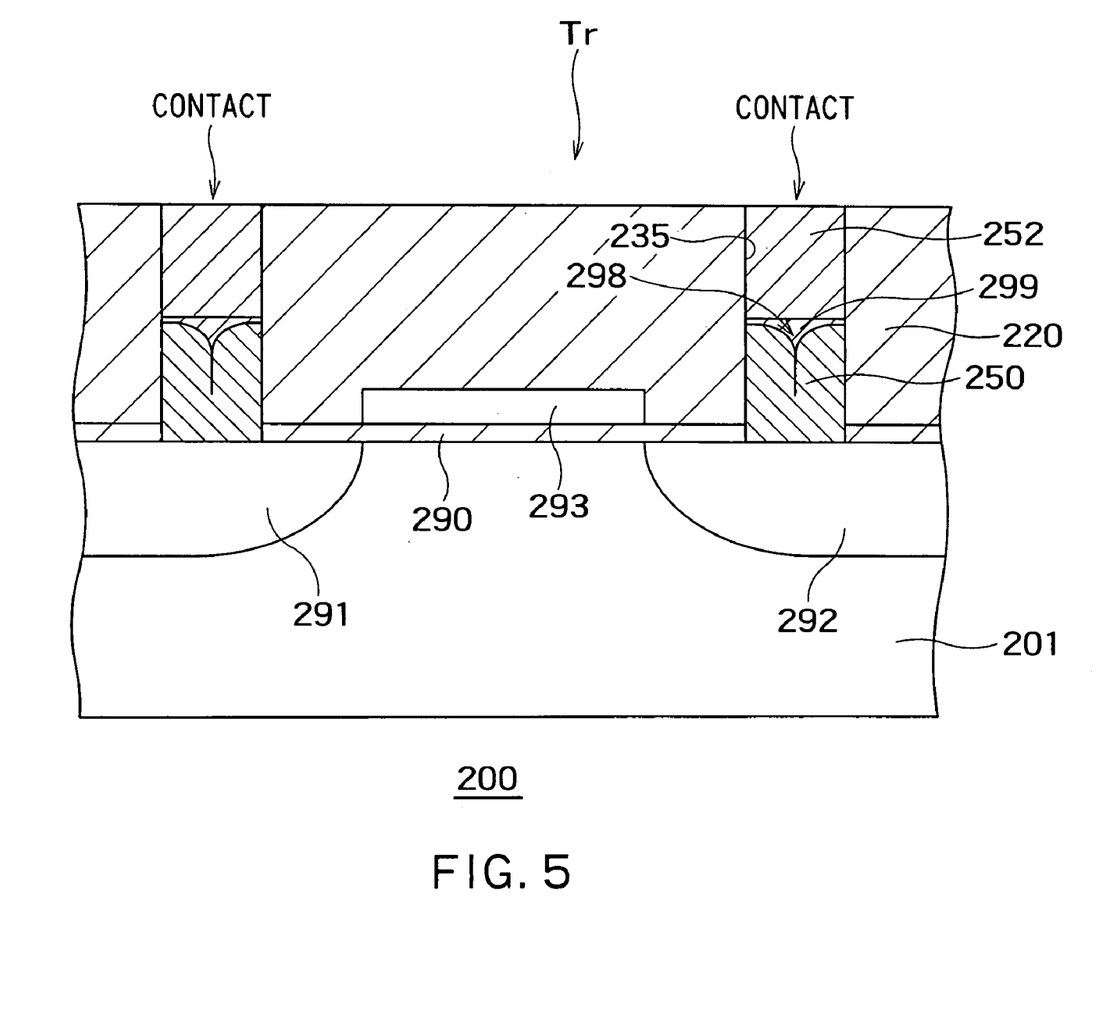
FIG. 5 is a cross-sectional view of a semiconductor device 200 including a buried layer used as the contact portion to the source/drain diffusion layers.

FIG. 5 is a cross-sectional view of a semiconductor device 200 including such a buried layer used as the contact portion to the source/drain diffusion layers. The semiconductor device 200 includes a transistor Tr. The transistor Tr includes a semiconductor substrate 201, source/drain diffusion layers 291, 292, gate insulating film 290, gate electrode 293 and passivation film 220.

The transistor Tr further includes contacts connected to the source/drain diffusion layer 291, 292, respectively. Each contact includes a first conductor 250, buried layer 299 and second conductor 252 all buried in a trench 235.

The passivation layer 220 may be made of an insulating material such as a silicon oxide film, silicon nitride film, or the like. Each trench 235 is a contact hole formed in the protective film 220 to reach the source or drain diffusion layer 291 or 292. The first conductor 250 is made of doped polysilicon, for example. The second conductor 252 is made of a metal such as tungsten, for example.

The buried layer 299 is made of a material which has a melting point lower than that of the first conductor 250 and which is electrically conductive. For example, the buried layer 299 is made of germanium containing an n-type impurity or silicon germanium ($Si_XGe_{1-X}$ (0<X<1)) containing an n-type impurity.

The buried layer 299 is buried in a V-shaped recess 298 sunken from the top surface of the first conductor 250. Since the buried layer 299 is electrically conductive, the first conductor 250 is electrically connected to the second conductor 252. Therefore, the first and second conductors are reliably connected to the source or drain diffusion layers 291, 292.

Next explained is a manufacturing method of the semiconductor device 200.

By known techniques, the source/drain diffusion layers 291, 292, gate insulating film 290, gate electrode 293 and protective film 220 are formed in and on the semiconductor substrate 201. Thereafter, the protective layer 220 and the gate insulating film 290 are etched to form the trenches 235.

After that, doped polysilicon is deposited in the trenches 235, and next etched back by CDE, thereby to form the first conductor 250. As a result of the etch-back process, the V-shaped recess 298 appears on the top surface of the first conductor 250.

If an existing method is used, a silicon oxide film is subsequently deposited and patterned for making interconnections. In this case, the silicon oxide film is deposited also in the V-shaped recess 298. Although the silicon oxide film should be removed from inside the trench 235 by the wiring patterning, the existing method fails to remove the silicon oxide film from the V-shaped recess 298 and cannot prevent it from remaining there as a residual oxide (not shown). The residual oxide prevents electrical connection between the first and second conductors 250, 252.

The instant embodiment, however, deposits germanium or silicon germanium as the burying-use material to be used as the buried layer 299 after forming the first conductor 250. The process conditions for deposition of germanium or silicon germanium are the same as the process conditions used in the first embodiment for deposition of germanium or silicon germanium (see FIG. 2C).

After that, the buried layer 299 is heated to a temperature higher than the melting point of its material and lower than the melting point of the first conductor 250. Conditions used for this annealing are the same as the annealing conditions used in the first embodiment for annealing the burying-use material 210 (see FIG. 3A).

As a result of the annealing, the germanium component and silicon of the first conductor 250 interact near the recess 298. This causes the germanium concentration of the burying-use material 210 to become higher near the recess 298 than on the sidewall of the trench 235.

After that, the burying-use material existing on the sidewall of the trench 235 is removed by etching. Conditions for this etching are the same as the conditions used in the first embodiment for etching the burying-use material 210 (see FIG. 3B). Thus the buried layer 299 is obtained.

As already explained, the germanium concentration becomes higher near the recess 298 than on the sidewall of the trench 235. Therefore, the burying-use material on the sidewall of the trench 235 is removed relatively easily, but the burying-use material 210 near the recess 298 is more likely to remain.

After that, a silicon oxide film is deposited and patterned for making interconnections. According to the instant embodiment, since the recess 298 is filled with the buried layer 299, the silicon oxide film does is not deposited in the recess 298 but only on the flat buried layer 299. Therefore, when the silicon oxide film is patterned, it never remains in the trench 235.

After that, tungsten is stacked or deposited by vapor deposition, and its top surface is polished by CMP, for example, thereby to form the second conductor 252 on the buried layer 299. Since the buried layer 299 is electrically conductive, the second conductor 252 is connected to the first conductor 250. As a result, contacts do not fail to make reliable electrical connection. In this manner, the invention is applicable also to contact plugs.

The semiconductor device and its manufacturing method explained as the second embodiment of the invention ensure that reliable connection of the first and second conductors in each trench satisfies the requirement of higher integration and microminiaturization.

What is claimed is:

1. A semiconductor device comprising:
   a semiconductor substrate including a trench having an inner wall;
   a first storage node electrode formed in the trench, having a recess with a V-shaped cross section in a top surface thereof;
   a capacitor insulating film located between the first storage node electrode and the inner wall;
   a buried layer formed on the recess, wherein the buried layer is electrically conductive;
   a second storage node electrode formed on the buried layer in the trench;
   a collar insulating film located between the second storage node electrode and the inner wall; and
   a buried strap formed above the second storage node electrode in the trench.

2. The semiconductor device according to claim 1, wherein the first and second storage node electrodes and the buried strap each comprise polysilicon and the buried layer comprises germanium or silicon germanium.

3. The semiconductor device according to claim 1, further comprising an insulating thin-film portion located between the second storage node electrode and the buried strap.

4. A semiconductor device comprising:
   a semiconductor substrate having a semiconductor layer of a first conduction type, including a trench having an inner surface;
   a gate electrode formed on the semiconductor layer via a gate insulating film;
   a source region and a drain region each of a second conduction type formed on a surface layer of the semiconductor layer; and
   a trench capacitor electrically connected to one of the source and drain regions, the trench capacitor including
   a capacitor insulating film formed on the inner surface, the capacitor insulating film located in a lower portion of the trench,
   a collar insulating film formed above the capacitor insulating film in the inner surface, and
   a storage node electrode buried in the trench, and electrically connected to one of the source and drain regions, the storage node electrode including
   a first conductive layer formed on the capacitor insulating film in the trench to bury the lower portion, and having a recess at the upper surface with a V-shaped cross section a second conductive layer buried in the recess,
   a third conductive layer formed on the collar insulating film in the trench, and a fourth conductive layer formed above the third conductive layer in the trench.

5. The semiconductor device according to claim 4, wherein the first, third, and fourth conductive layers each comprise polysilicon and the second conductive layer comprises germanium or silicon germanium.

6. The semiconductor device according to claim 4, further comprising an insulating thin-film portion located between the third and fourth conductive layers.

7. The semiconductor device according to claim 1, wherein the buried layer has a flat top surface substantially parallel to a surface of the semiconductor substrate.

8. The semiconductor device according to claim 1, wherein the first storage node electrode includes at least one of a seam or a void.

9. A semiconductor device comprising:
   a semiconductor substrate including a trench having an inner wall;
   a first storage node electrode formed in the trench including a seam formed in the first storage node electrode, an entire length of the seam being parallel to the inner wall, and a V-shaped recess formed in a top surface of the first storage node electrode in contact with the seam;
   a capacitor insulating film located between the first storage node electrode and the inner wall;
   a buried layer formed on the recess, the buried layer including an electrically conducting material;
   a second storage node electrode formed on the buried layer in the trench;
   a collar insulating film located between the second storage node electrode and the inner wall; and
   a buried strap formed above the second storage node electrode in the trench.

10. The semiconductor device according to claim 9, wherein the first and second storage node electrodes and the buried strap each comprise polysilicon and the buried layer comprises germanium or silicon germanium.

11. The semiconductor device according to claim 9, further comprising an insulating thin-film member located between the second storage node electrode and the buried strap.

12. The semiconductor device according to claim 9, wherein the recess has an approximately V-shaped cross section.

13. The semiconductor device according to claim 9, wherein the buried layer includes a flat upper surface.

14. The semiconductor device according to claim 12, further comprising an insulating thin-film member located between the second storage node electrode and the buried strap.

* * * * *